(12) United States Patent
Nand et al.

(10) Patent No.: US 10,481,814 B1
(45) Date of Patent: Nov. 19, 2019

(54) ARCHITECTURE FOR ASYNCHRONOUS MEMORY TRANSFER FOR KERNELS IMPLEMENTED IN INTEGRATED CIRCUITS

(71) Applicant: Xilinx, Inc., San Jose, CA (US)

(72) Inventors: Heera Nand, Alwar (IN); Amit Kasat, Hyderabad (IN)

(73) Assignee: XILINX, INC., San Jose, CA (US)

( * ) Notice: Subject to any disclaimer, the term of this patent is extended or adjusted under 35 U.S.C. 154(b) by 168 days.

(21) Appl. No.: 15/635,646

(22) Filed: Jun. 28, 2017

(51) Int. Cl.
*G06F 17/50* (2006.01)
*G06F 3/06* (2006.01)

(52) U.S. Cl.
CPC .......... *G06F 3/0629* (2013.01); *G06F 3/0656* (2013.01); *G06F 3/0659* (2013.01); *G06F 3/0673* (2013.01); *G06F 17/5045* (2013.01)

(58) Field of Classification Search
CPC .... G06F 3/0629; G06F 3/0656; G06F 3/0673; G06F 17/5045; G06F 3/0659
See application file for complete search history.

(56) References Cited

U.S. PATENT DOCUMENTS

| | | | |
|---|---|---|---|
| 9,824,173 B1 * | 11/2017 | An ...................... | G06F 17/5054 |
| 9,864,828 B1 * | 1/2018 | Puthana .............. | G06F 17/5077 |
| 9,977,758 B1 * | 5/2018 | Schumacher ....... | G06F 13/4221 |
| 2018/0074787 A1 * | 3/2018 | Aydonat ................... | G06F 7/44 |

* cited by examiner

*Primary Examiner* — Vuthe Siek
(74) *Attorney, Agent, or Firm* — Kevin T. Cuenot (57) ABSTRACT

Implementing a kernel as circuitry in an integrated circuit can include determining, using a processor, memory access operations and work operations from kernel program code and generating, using the processor, a circuit design from the kernel program code. The circuit design implements a circuit architecture having a memory access circuit configured to perform the memory access operations and an execution circuit configured to perform the work operations concurrently with the memory access operations.

20 Claims, 3 Drawing Sheets

FIG. 5

ARCHITECTURE FOR ASYNCHRONOUS MEMORY TRANSFER FOR KERNELS IMPLEMENTED IN INTEGRATED CIRCUITS

TECHNICAL FIELD

This disclosure relates to integrated circuits (ICs) and, more particularly, to an architecture for asynchronous memory transfer for kernels implemented in ICs.

BACKGROUND

Some modern computer programs are adapted to execute on a heterogeneous computing system (HCS) that includes a host processor and one or more other devices. These computer programs typically include a host portion and one or more kernels. The host portion is compiled into executable program code that executes on the host processor. The kernels are compiled for implementation and/or execution by the other devices of the HCS.

In some cases, the kernels are compiled into executable program code. The executable versions of the kernels are executed by the devices of the HCS other than the host processor. For example, kernels may be compiled for execution by devices such as graphics processing unit(s) (GPUs) and/or digital signal processor(s) (DSPs). In other cases, the kernels are hardware accelerated by compiling the kernels into circuitry (e.g., a circuit design) that is implemented within an IC. As an illustrative example, a circuit design may be generated from the kernel and loaded into a programmable IC and/or implemented in an application specific IC thereby implementing the kernel in circuitry or hardware. The hardware implementation of the kernel is functionally equivalent to the executable version of the kernel.

SUMMARY

One or more embodiments are directed to methods for implementing a kernel as circuitry in an integrated circuit (IC). In one aspect, a method can include determining, using a processor, memory access operations and work operations from kernel program code. The method also can include generating, using the processor, a circuit design from the kernel program code. The circuit design implements a circuit architecture having a memory access circuit configured to perform the memory access operations and an execution circuit configured to perform the work operations concurrently with the memory access operations.

One or more embodiments are directed to an IC having a hardware architecture for a kernel. The hardware architecture can include a shared memory circuit configured to implement a buffer of the kernel and a memory access circuit configured to perform memory access operations of the kernel. The memory access operations can include read operations and write operations that exchange data between a global memory and the shared memory. The hardware architecture can also include an execution circuit coupled to the memory access circuit and configured to perform work operations of the kernel using the data stored in the shared memory.

One or more embodiments are directed to systems for implementing a kernel as circuitry in an IC. In one aspect, a system includes a memory configured to store program code and a processor coupled to the memory. The processor, in response to executing the program code, is configured to initiate operations. The operations include determining memory access operations and work operations from kernel program code and generating a circuit design from the kernel program code. The circuit design implements a circuit architecture having a memory access circuit configured to perform the memory access operations and an execution circuit configured to perform the work operations concurrently with the memory access operations.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs). One or more embodiments described within this disclosure are directed to an architecture for implementing kernels as hardware and/or circuitry within ICs. The architecture supports asynchronous memory transfers. In an aspect, the architecture implements a kernel in hardware using multiple different circuits to facilitate parallelism. As implemented in the IC, the parallelism enabled by the architecture reduces execution time of the kernel thereby increasing throughput of the hardware implementation of the kernel.

In one or more embodiments, the architecture separates work operations of the kernel from data transfer operations of the kernel. The kernel is transformed into a circuit design having an architecture that includes a memory access circuit and an execution circuit. The memory access circuit is capable of performing memory accesses. The memory access circuit, for example, is capable of making data available to the execution circuit and outputting results from the execution circuit. The execution circuit is capable of performing the work operations of the kernel. The memory access circuit and the execution circuit are capable of independent and concurrent, or parallel, operation. For example, the execution circuit is capable of operating on data while the memory access circuit obtains additional data for the execution circuit to consume and/or outputs results generated by the execution circuit.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figure 1:
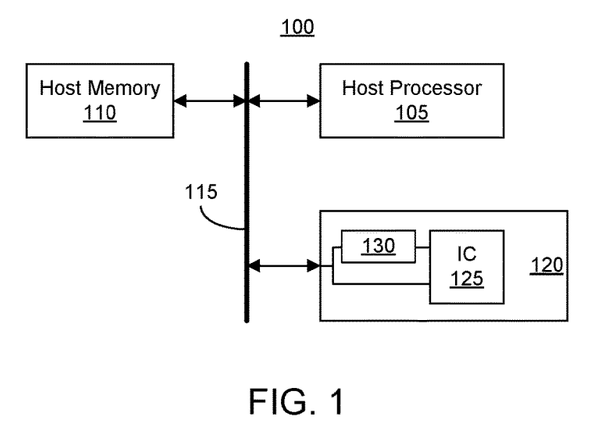
FIG. 1 illustrates an example of a heterogeneous computing system.

FIG. 1 illustrates an example of a heterogeneous computing system (HCS) 100. HCS 100 is an example of a computing system that includes one or more kernels implemented in hardware. HCS 100 includes a host processor 105. Host processor 105 is coupled to host memory 110 and to hardware accelerator 120 through interface circuitry 115. HCS 100 stores computer readable instructions (also referred to as "program code") within host memory 110. Host processor 105 is capable of executing the host program code accessed from host memory 110 via interface circuitry 115.

Host memory 110 includes one or more physical memory devices such as, for example, a local memory and one or more bulk storage devices. The term "local memory" refers to non-persistent memory device(s) generally used during actual execution of the program code. Examples of local memory include random access memory (RAM) and/or any of the various types of RAM that are suitable for use by a processor during execution of program code. The term "bulk storage device" refers to persistent data storage devices. Examples of a bulk storage device include a hard disk drive (HDD) and a solid state drive (SSD). HCS 100 may also include one or more cache memories (not shown) that provide temporary storage of at least some program code to reduce the number of times program code must be retrieved from a bulk storage device during execution.

Examples of interface circuitry 115 include, but are not limited to, an input/output (I/O) subsystem, an I/O interface, a bus system, and a memory interface. For example, interface circuitry 115 may be one or more of any of several types of bus structures, including a memory bus or memory controller, a peripheral bus, an accelerated graphics port, and a processor or local bus using any of a variety of bus architectures.

Hardware accelerator 120 is capable of implementing one or more kernels in hardware. In one or more embodiments, hardware accelerator 120 is implemented as a circuit board, e.g., a printed circuit board, having one or more ICs coupled thereto. In the example of FIG. 1, hardware accelerator 120 includes an IC 125 and a global memory 130. Hardware accelerator 120 is coupled to interface circuitry 115. Accordingly, hardware accelerator 120 is capable of communicating with host processor 105. More particularly, host processor 105 is capable of reading and/or writing to global memory 130 and communicating with IC 125. Further, IC 125 is capable of reading and/or writing to global memory 130.

IC 125 is capable of implementing a hardware architecture for implementing one or more kernels. In one or more embodiments, a kernel is implemented within IC 125 using an architecture that supports asynchronous memory transfers. It should be appreciated that more than one kernel may be implemented concurrently in IC 125 where each kernel is implemented using the architecture described herein. The architecture includes a memory access circuit and an execution circuit capable of parallel operation. The architecture may include additional components such as a shared memory and/or status registers.

In general, host processor 105 is capable of offloading tasks to hardware accelerator 120. For example, host processor 105 is capable of invoking one or more hardware implementations of kernels implemented in hardware accelerator 120 and, more particularly, in IC 125. Host processor 105 is capable of writing data to global memory 130. IC 125 is capable of reading the data from global memory 130, operating upon the data, and writing the results of the processing back to global memory 130. Host processor 105 is capable of reading the results from global memory 130.

In one or more embodiments, IC 125 is implemented as an application specific integrated circuit (ASIC). In one or more embodiments, IC 125 is implemented as a programmable IC. Examples of a programmable IC include, but are not limited to, a field programmable gate array (FPGA), a programmable logic array (PLA), or other circuit that includes at least some programmable circuitry. The kernel(s) may be implemented using the programmable circuitry of the IC.

Figure 2:
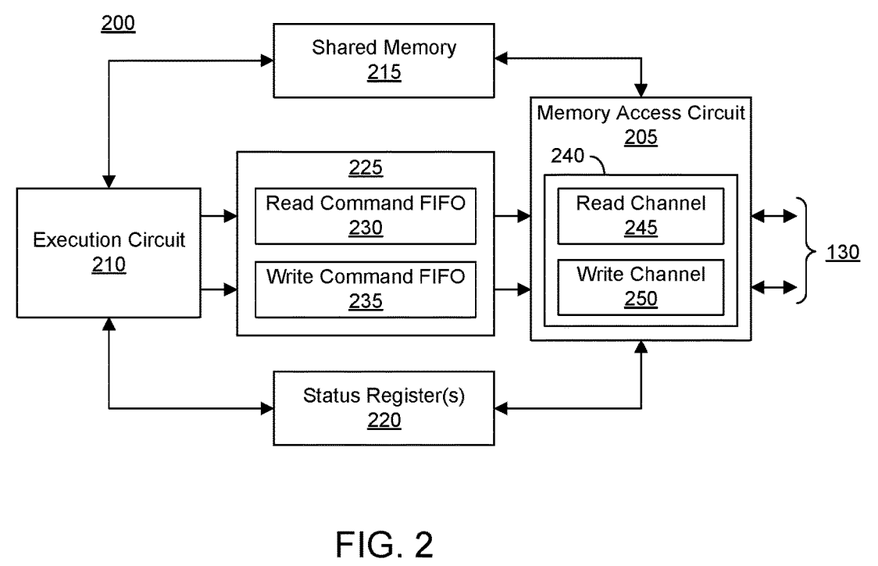
FIG. 2 illustrates an example architecture for implementing a kernel in hardware.

FIG. 2 illustrates an example architecture 200 for implementing a kernel in hardware. For example, architecture 200 may be implemented in IC 125 of FIG. 1 to implement a kernel in circuitry (e.g., hardware). In the example of FIG. 2, architecture 200 generally distinguishes between different types of operations performed by a kernel as specified in the kernel program code. These different types of operations include memory access operations and work operations.

The different types of operations are assigned to, and performed by, different circuit blocks in architecture 200 to facilitate parallelism. The parallelism achieved by architecture 200 reduces execution time of the kernel as implemented in the IC. In general, memory access circuit 205 performs memory access operations, while execution circuit 210 performs work operations. Memory access circuit 205 and execution circuit 210 are capable of operating independently and in parallel, e.g., concurrently or simultaneously.

In the example of FIG. 2, architecture 200 further includes a shared memory 215 and status registers 220. Execution circuit 210 is coupled to memory access circuit 205, in part, through command memories 225. In the example of FIG. 2, command memories 225 include a read command first-in-first-out (FIFO) 230 and a write command FIFO 235. Read command FIFO 230 and write command FIFO 235 are implemented as memory circuits. Further, each of memory access circuit 205 and execution circuit 210 is coupled to, and capable of accessing, shared memory 215 and status register(s) 220.

A memory access operation refers to a data transfer between global memory 130 and shared memory 215. Memory access operations, in general, provide data to the circuit implementation of the kernel for processing. Memory access operations also output data, e.g., results, generated by the circuit implementation of the kernel. For example, memory access operations include read operations that read data from global memory 130 and write the data to shared memory 215. Memory access operations also include write operations that read data from shared memory 215 and write the data to global memory 130.

In the example of FIG. 2, memory access circuit 205 includes a global memory interface 240 that is coupled to global memory 130. In the example of FIG. 2, global memory interface 240 includes a read channel 245 and a separate and independent write channel 250. Using read channel 245 and write channel 250, memory access circuit 205 is capable of performing read operations and write operations concurrently. In one or more embodiments, read channel 245 and write channel 250 may be implemented as direct memory access (DMA) circuits capable of directly accessing global memory 130.

Execution circuit 210 is capable of generating read commands to obtain data from global memory 130. For example, execution circuit 210 is capable of generating a read command and outputting the read command to read command FIFO 230. Read channel 245 is capable of reading the read commands from read command FIFO 230 and executing the read commands. In response to executing a read command, read channel 245 is capable of reading data from an address in global memory 130 and transferring the data to an address in shared memory 215.

Shared memory 215 may be implemented "on-chip" within IC 125. In one or more embodiments, where IC 125 is a programmable IC, shared memory 215 may be implemented as one or more block RAMs. In particular embodiments, shared memory 215 implements one or more different buffers specified within the kernel program code. In any case, read channel 245 is capable of writing data to shared memory 215. Write channel 250 is configured to read data from shared memory 215.

Execution circuit 210 is capable of performing one or more work operations, e.g., data operations, on the data transferred into shared memory 215. Work operations include any operation specified within the kernel program code that is implemented using architecture 200. For example, work operations may include digital signal processing operations such as image processing operations, audio processing operations, or any other type of operation that acts on data in shared memory and that is specified in the kernel program code other than a data transfer operation. Execution circuit 210 is capable of storing data generated from performing the work operations, e.g., results, in shared memory 215.

Accordingly, execution circuit 210 is capable of generating write commands to output data from shared memory 215 to global memory 130, from which the host processor may obtain the results. For example, execution circuit 210 is capable of generating a write command and outputting the right command to write command FIFO 235. Write channel 250 is capable of reading the write commands from write command FIFO 235 and executing the write commands. In response to executing a write command, write channel 250 is capable of reading data from an address in shared memory 215 and writing the data to an address in global memory 130.

In general, execution circuit 210 is capable of sending read commands and write commands to command memories 225 based on the sequence of the kernel program code implemented in hardware. In one or more embodiments, the read commands and the write commands are non-blocking calls. As such, execution circuit 210 is capable of sending multiple read commands and/or write commands back-to-back to memory access circuit 205. Execution circuit 210 is also capable of waiting for particular memory transfer operations to complete based upon the sequence of kernel program code implemented in hardware. Execution circuit 210 is capable of implementing a wait state until a particular memory transfer operation is finished. Accordingly, execution circuit 210 is capable of waiting for data to become available in shared memory 215 prior to starting to process the data.

Status registers 220 may be implemented as one or more memories, e.g., registers, capable of storing values indicating status of particular data transfer operations. For example a particular status register may store a value indicating that a particular data transfer is still in progress or has completed. Memory access circuit 205 is capable of updating status registers 220 to indicate the status of a data transfer operation in response to a change in the status. Execution circuit 210 is capable of reading the status(es) from status registers 220 and determining whether to begin processing and/or continue waiting as described based upon the status(es) stored in status registers 220.

In accordance with the example embodiments described herein, kernels are typically specified in a high-level programming language. An example of a high-level programming language is OpenCL. It should be appreciated that OpenCL is provided for purposes of illustration only and that kernels may be specified in other suitable high-level programming languages such as C++. In this regard, the embodiments described within this disclosure are not intended to be limited by the particular type of high-level programming language used to specify the kernel(s).

An electronic design automation (EDA) system is capable of generating a circuit design from the kernel program code using the example architecture(s) described herein. The circuit design may be specified as a register transfer level (RTL) description, as a netlist, using a hardware description language, or using another suitable format for describing circuitry and the architecture of such circuitry.

Example 1 illustrates program code specifying a kernel (e.g., "kernel program code"). The kernel program code is specified in OpenCL. Example 1 illustrates kernel program code that uses an async_work_group_copy( ) function.

Example 1

```
_kernel
void kernel(TYPE * input, TYPE * output, int chunk_size){
    local TYPE rbuffer0[BUFFERSIZE]; // Read Buffer0
    local TYPE rbuffer1[BUFFERSIZE]; // Read Buffer1
    local TYPE wbuffer0[BUFFERSIZE]; // Write Buffer0
    local TYPE wbuffer1[BUFFERSIZE]; // Write Buffer1
    event_t re0, re1; // Memory Read Events
    event_t we0, we1; // Memory Write Events
    bool flag=0; //Flag to select Buffer0 or Buffer1
    copy0: async_work_group_copy(buffer0,&input[0],BUFFERSIZE,re0);
    for(int itr=0 ; itr < chunk_size; itr++)
    {
        unsigned int loc = itr * BUFFERSIZE;
```

Example 1

```
if(flag==0){
        //reading the next dataset
Read1:  async_work_group_copy(rbuffer1,&input[loc+BUFFERSIZE],BUFFERSIZE,re1);
        //wait to finish buffer0 read and buffer0 write
        wait_group_events(1, &re0);
        wait_group_events(1, &we0);
Op0:    kernel_operation(rbuffer0,BUFFERSIZE,wbuffer0);
Write0: async_work_group_copy(wbuffer0,&output[loc],BUFFERSIZZE,we0);
        }else{
        //reading the next dataset
Read0:  async_work_group_copy(rbuffer0,&input[loc+BUFFERSIZE],BUFFERSIZE,re0);
        //wait to finish buffer1 read and buffer1 write
        wait_group_events(1, &re1);
        wait_group_events(1, &we1);
Op1:    kernel_operation(rbuffer1,BUFFERSIZE,wbuffer1);
Write1: async_work_group_copy(wbuffer1,&output[loc],BUFFERSIZZE,we1);
    }
    flag = !flag;
}
}//end of kernel
```

Figure 3:
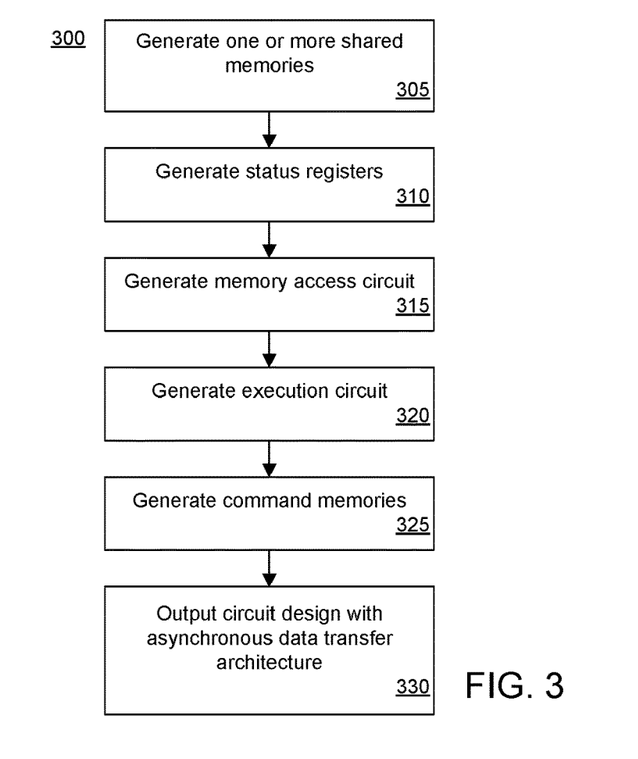
FIG. 3 illustrates an example method of implementing a kernel in hardware using an architecture for asynchronous data transfer.

FIG. 3 illustrates an example method 300 of implementing a kernel in hardware using an asynchronous data transfer architecture. Method 300 may be performed automatically by a system such as an EDA system as described herein. For purposes of illustration, method 300 references the kernel program code of Example 1. In general, the EDA system is capable of processing the kernel program code of Example 1 or other kernel program code to generate a circuit design. The circuit design specifies an architecture that supports asynchronous data transfer. For example, the circuit design is implemented using the architecture of FIG. 2. Method 300 may begin in a state where the EDA system has received kernel program code for processing.

In block 305, the EDA system generates one or more shared memories within the circuit design. For purposes of discussion, "generating" a structure within the circuit design refers to the EDA system automatically generating and inserting appropriate RTL or other hardware description implementing the referenced structure(s) within the circuit design. The EDA system, in general, generates shared memories that correspond to buffers within the kernel program code. For example, the EDA system is capable of detecting the buffer declarations of the kernel program code excerpted from Example 1 below.

```
local TYPE rbuffer0[BUFFERSIZE];    // Read Buffer 0
local TYPE rbuffer1[BUFFERSIZE];    // Read Buffer 1
local TYPE wbuffer0[BUFFERSIZE];    // Write Buffer 0
local TYPE wbuffer1[BUFFERSIZE];    // Write Buffer 1
```

In response to detecting the buffer declarations, the EDA system generates one shared memory for each buffer declaration. Referring to the above kernel program code, the EDA system creates four shared memories corresponding to Read Buffer 0 (rbuffer0), Read Buffer 1 (rbuffer1), Write Buffer 0 (wbuffer0), and Write Buffer 1 (wbuffer1).

In block 310, the EDA system generates status registers within the circuit design. In general, the EDA system is capable of generating status registers that correspond to events within the kernel program code. For example, the EDA system is capable of detecting the event declarations from the kernel program code excerpted from Example 1 below.

```
event_t re0, re1;     // Memory Read Events
event_t we0, we1;     // Memory Write Events
```

In response to detecting the event declarations, the EDA system generates a status register for each event. In this example, the EDA system generates a status register for event Re0, a status register for Re1, a status register for We0, and another status register for We1. In one or more embodiments, the EDA system is capable of generating one or more additional status registers. For example, the EDA system is capable of generating one or more global status registers described in greater detail below.

In block 315, the EDA system generates the memory access circuit within the circuit design. The EDA system generates the memory access circuit to implement the various data transfer operations of the kernel program code. For example, the EDA system is capable of detecting occurrences of the async_work_group_copy function within the kernel program code of Example 1. The read operations annotated within the kernel program code as "Read0" and "Read1" are implemented by the read channel of the memory access circuit. The write operations annotated within the kernel program code as "Write0" and "Write1" are performed by the write channel of the memory access circuit.

In block 320, the EDA system generates the execution circuit to implement the various work operations of the kernel program code. For example, the EDA system is capable of detecting functions such as "kernel_operation" as the kernel operations. For purposes of illustration, the work operations are annotated as "Op0" and "Op1." The EDA system generates the execution circuit within the circuit design to perform the work operations detected in the kernel program code.

In block 325, the EDA system generates the command memories. For example, the EDA system is capable of generating the read command FIFO and the write command FIFO within the circuit design. The EDA system further couples the execution circuit and the memory access circuit to the command memories as illustrated in the example of FIG. 2.

In block 330, the EDA system outputs the circuit design. The resulting circuit design utilizes the parallel architecture described herein. In one or more embodiments, the EDA system is further capable of synthesizing, placing, and/or routing the circuit design. The EDA system is also capable of generating a configuration bitstream and loading the configuration bitstream specifying the kernel circuitry into a programmable IC to implement the kernel circuitry therein. It should be appreciated that the particular manner in which the circuit design is implemented within the IC may vary based upon the type of IC that is used. The use of a programmable IC and the generation of a configuration bitstream is provided for purposes of illustration only and is not intended as a limitation of the example embodiments described within this disclosure.

Using the architecture described herein in connection with FIG. 2 to implement a kernel in hardware facilitates faster execution of the kernel (e.g., requires less time to execute). As an illustrative example, conventional EDA systems that implement kernel program code in hardware generate a circuit architecture that performs operations sequentially. For example, the circuit architecture realized for the kernel program code of Example 1 by a conventional EDA system may execute sequentially as follows: Read0, Read1, Op0, Write0, Read0, Op1, Write1, Read1, Op0, and Write0. If each of the operations described is presumed to require the same time "t," N different iterations of the circuit over time will require (t+t+t)*N=3*t*N, where "N" is an integer value. In this example, specifying more than one buffer does not automatically result in parallel operation or efficient usage of the multiple buffers due to the way in which conventional EDA systems compile the kernel program code into hardware. The resulting hardware implementation, in effect, utilizes more hardware resources than is necessary since multiple memories are created, but not used to support parallel operation.

Table 1 below illustrates efficiencies achieved using the architecture described in connection with FIG. 2 to implement a kernel in circuitry.

TABLE 1

| Read Channel | Read0 | Read1 | Read0 | Read1 | Read0 | |
|---|---|---|---|---|---|---|
| Execution Circuit | | Op0 | Op1 | Op0 | Op1 | Op0 |
| Write Channel | | | Write0 | Write1 | Write0 | Write1 | Write0 |

Referring to Table 1, the execution circuit is capable of sending Read0 and Read1 commands to the memory access circuit. The execution circuit is capable of starting work operation (e.g., Op0) as soon as the Read0 operation completes. The execution circuit does not need to wait for the Read1 operation to finish. While the execution circuit is performing work operation Op0, the memory access circuit can perform the Read1 operation. When the execution circuit starts work operation Op1, the data from performing the Read1 operation will be in shared memory. Accordingly, the execution circuit is capable of immediately starting work operation Op1 just after completing work operation Op0.

After two sequences of operations, Table 1 illustrates that read, write, and work operations are running in parallel. The memory access circuit will be writing the result of the Write0 operation to global memory and at the same time performing Read0 as the next operation. At the same time, the execution circuit performs the work operation Op1 on data obtained from the Read1 operation. Similar parallelism is observable with respect to Read1, Write1, and Op0.

The parallel execution of the memory access circuit and the execution circuit reduces the overall kernel execution time and improves performance of the hardware implementation of the kernel program code. Table 1 illustrates that the overall execution time of the hardware implementation of the kernel program code of Example 1 may be reduced from 3*t*N to approximately t*N when implemented using the architecture described in connection with FIG. 2.

For purposes of illustration, an example implementation of the architecture described in connection with FIG. 2 is provided below using the kernel program code of Example 1. The example operations described may be performed by the EDA system as part of the compilation process. The example provided is not intended as a limitation of the embodiments described herein, but rather to illustrate a possible implementation.

In one or more embodiments, the EDA system is capable of assigning a unique identifier (ID) to each of the shared memories that are generated. Table 2 below illustrates the shared memories that are generated numbered 1-4, the corresponding buffer from the kernel program code, and the unique ID for each of the shared memories.

TABLE 2

| Shared Memory # | Buffer | Unique ID |
|---|---|---|
| 1 | rbuffer0 | 0 |
| 2 | rbuffer1 | 1 |
| 3 | wbuffer0 | 2 |
| 4 | wbuffer1 | 3 |

The EDA system further is capable of assigning unique IDs to events. Table 3 below illustrates an example assignment of unique event IDs to events from the kernel program code of Example 1. For each different event shown in Table 3, the EDA system is capable of generating a status register, e.g., an event register, corresponding to the event.

TABLE 3

| Event Number | Event Name | Unique ID |
|---|---|---|
| 1 | Global Read Circuit Event | 0 |
| 2 | Global Write Circuit Event | 1 |
| 3 | Re0 | 2 |
| 4 | Re1 | 3 |
| 5 | We0 | 4 |
| 6 | We1 | 5 |

Referring to Table 3, the Global Read Circuit Event and the Global Write Circuit Event are added to the circuit design, but not specified within Example 1. In one or more embodiments, the EDA system adds these two status registers independently of the kernel program code to support parallelism. Each of the registers generated for the events of Table 3 stores the status of the corresponding read or write command, as the case may be. If, for example, a global read (write) circuit event is IDLE (e.g., 1), there is no pending read (write) command. For example, referring to the architecture of FIG. 2, there is no read (write) command in the read (write) command FIFO. If, for example, the global read event register is BUSY (e.g., 0), the memory access circuit (e.g., the read channel) is performing a read operation from the global memory to the shared memory. If, for example, the global write event register is BUSY, the memory access circuit (e.g., the write channel) is performing a write operation from the shared memory to the global memory.

In particular embodiments, the EDA system, in compiling the kernel program code to generate the circuit architecture, is capable of allocating identifiers based upon the number of kernels that are created.

In one or more embodiments, the execution circuit is capable of using a read and/or write command format as shown in Table 4 below.

TABLE 4

| Global Memory Address | Shared Memory Address | Shared Memory ID | Event ID | Size |
|---|---|---|---|---|

Referring to Table 4, the global memory address specifies a global memory location. For a read command, the global memory address is the source location in global memory. For a write command, the global memory address is the destination location in global memory. The shared memory address specifies a location in the shared memory. For read commands, the shared memory address is the destination in shared memory. For write commands, the shared memory address specifies the source location in shared memory. The local memory identifier specifies the unique identifier of the shared memory that is to be used. The event identifier specifies the particular event, and as such, the particular status registers that is to be updated to track the command. The kernel execution circuit is capable of writing read and/or write commands to the appropriate command FIFO using this structure.

Table 5 illustrates example read and/or write command structures that can be written to the appropriate command FIFO by the execution circuit.

TABLE 5

| Command | Global Memory Address | Local Memory Address | Shared Memory ID | Event ID | Size |
|---|---|---|---|---|---|
| async_work_group_copy(rbuffer0, &input[loc],BUFFERSIZE,re0) | loc | 0 | 3 | 5 | BUFFERSIZE |
| async_work_group_copy(wbuffer1, &input[lo],BUFFERSIZE,we1) | loc | 0 | 1 | 3 | BUFFERSIZE |
| async_work_group_copy(rbuffer1, &input[loc],BUFFERSIZE,re1) | loc | 0 | 1 | 3 | BUFFERSIZE |
| async_work_group_copy(wbuffer0, &input[loc],BUFFERSIZE,we0) | loc | 0 | 2 | 4 | BUFFERSIZE |

The async_work_group_copy( ) API calls illustrated in Table 5 are non-blocking calls for the execution circuit of the kernel. The execution circuit, for example, is capable of writing the information specified in the rightmost 5 columns of Table 5 into the appropriate command FIFO and continue to the next operation. In response to writing a command to the appropriate command FIFO, the execution circuit further updates the appropriate status register to a value of 0 indicating a BUSY state.

Example 2 illustrates pseudo code illustrating functionality of the memory access circuit of the kernel implementation.

Example 2

```
While(1){
    if (read/write FIFO is empty){
        Global Write/Read Event Register=1;
        //Set the global read/write Event to IDLE state
    } else {
        Global Write/Read Event Register=0;
        //BUSY state
        Cmd=Read_Command_from_FIFO( );
        Extract Global Address, Local Memory ID, local
            Memory Address and size from cmd
        Do       memory_operation(Global_Address,
            Local_memory_ID,   Local_memory_Address,
            size);
        Extract event ID from Command;
        Event_registers[Event_ID]=1;
        //Completed
    }
}
```

Example 2 illustrates that while the read command FIFO is empty, the memory access circuit sets the global read event register to 1 (IDLE). Similarly, while the write command FIFO is empty, the memory access circuit sets the global write event register to 1 (IDLE).

Otherwise, the appropriate global event register is set to 0 (BUSY). The command is read from the appropriate command FIFO. The necessary data for effectuating the read and/or write is extracted. The memory access circuit performs the data transfer specified by the extracted data. The memory access circuit then determines the event ID and updates the status register corresponding to the event ID to indicate the status of the memory transfer operation.

In another aspect of the example described herein, a wait statement of the kernel program code may be implemented in the circuit design as a do-while statement. For example, the kernel program code implements a wait statement on the re0 event to ensure that data has been copied completely from global memory to shared memory using a command such as wait_group_events (1, &re0). The EDA system is capable of translating this command into a do-while loop within the circuit design as shown below in Example 3.

Example 3

```
do{
    event_reg=event_registers[re0];
} while(event_reg !=COMPLETED);
```

In some cases, kernel program code includes barrier statements. Barrier statements allow a designer that does not use events in the kernel program code to ensure that all the read commands and write commands have completed before moving to the next operation. The EDA system is capable of implementing a barrier statement in the kernel program code such as barrier (CLK_LOCAL_MEM_FENCE) within the circuit design as shown below in Example 4.

Example 4

```
do{
    // 0^th is for global read circuit event
    global_read_circuit_event=event registers [0];
    // 1^st is for the global write circuit event
    global_write_circuit_event=event_registers [1];
} while (global_read_circuit_event !=1~global_write-
    _circuit_event !=1);
```

The example embodiments provide various ways of effectuating handshake mechanisms between different circuit blocks. Still, the embodiments described within this disclosure are not intended to be limited to the particular examples provided.

Figure 4:
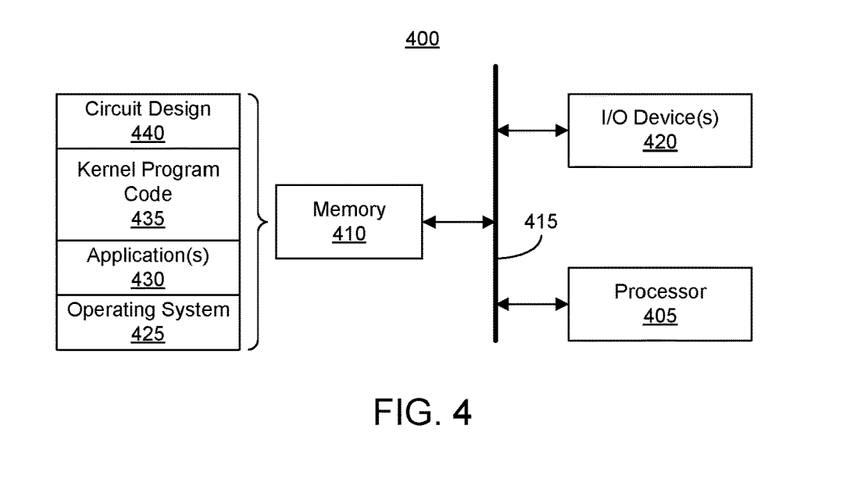
FIG. 4 illustrates an example of a data processing system for implementing a kernel in hardware.

FIG. 4 illustrates an example of a data processing system (system) 400 for use with one or more embodiments described herein. In an aspect, system 400 is implemented as a computer or other system or device that is suitable for storing and/or executing program code. System 400 is an example of an EDA system as described herein.

System 400 includes at least one processor 405, e.g., a central processing unit (CPU). Processor 405 is coupled to memory 410 through interface circuitry 415. System 400 stores computer readable instructions (also referred to as "program code") within memory 410. Memory 410 is an example of computer readable storage media. Processor 405 executes the program code accessed from memory 410 via interface circuitry 415.

Memory 410 includes one or more physical memory devices such as, for example, a local memory and one or more bulk storage devices as previously described herein in connection with FIG. 1. Interface circuitry 415 may also be implemented as generally described in connection with the interface circuitry of FIG. 1. By way of example, and not limitation, bus architectures include Industry Standard Architecture (ISA) bus, Micro Channel Architecture (MCA) bus, Enhanced ISA (EISA) bus, Video Electronics Standards Association (VESA) local bus, Peripheral Component Interconnect (PCI) bus, and PCI Express (PCIe).

System 400 further may include one or more input/output (I/O) devices 420 coupled to interface circuitry 415. I/O devices 420 may be coupled to system 400, e.g., interface circuitry 415, either directly or through intervening I/O controllers. Examples of I/O devices 420 include, but are not limited to, a keyboard, a display device, a pointing device, one or more communication ports, a network adapter, etc. A network adapter refers to circuitry that enables system 400 to become coupled to other systems, computer systems, remote printers, and/or remote storage devices through intervening private or public networks. Modems, cable modems, Ethernet cards, and wireless transceivers are examples of different types of network adapters that may be used with system 400.

Memory 410 stores one or more program modules. The program modules may generally include routines, programs, objects, components, logic, data structures, and so on. For purposes of illustration, memory 410 stores an operating system 425, one or more application(s) 430, and kernel program code 435. In one or more embodiments, application (s) 430 include an EDA application. System 400, upon executing application(s) 430, is capable of performing the operations described herein on kernel program code 435 to generate circuit design 440. Circuit design 440 implements the kernel program code as circuitry using the architecture described with reference to FIG. 2. Further, system 400 is capable of performing a design flow on circuit design 440 as described herein.

In an aspect, operating system 425 and application(s) 430, being implemented in the form of executable program code, are executed by system 400 and, more particularly, by processor 405, to perform the operations described within this disclosure. As such, operating system 425 and application(s) 430 may be considered an integrated part of system 400. Further, it should be appreciated that any data used, generated, and/or operated upon by system 400 (e.g., processor 405) are functional data structures that impart functionality when employed as part of the system.

System 400 may include fewer components than shown or additional components not illustrated in FIG. 4 depending upon the particular type of device and/or system that is implemented. In addition, the particular operating system and/or application(s) included may vary according to device and/or system type as may the types of I/O devices included. Further, one or more of the illustrative components may be incorporated into, or otherwise form a portion of, another component. For example, a processor may include at least some memory.

Figure 5:
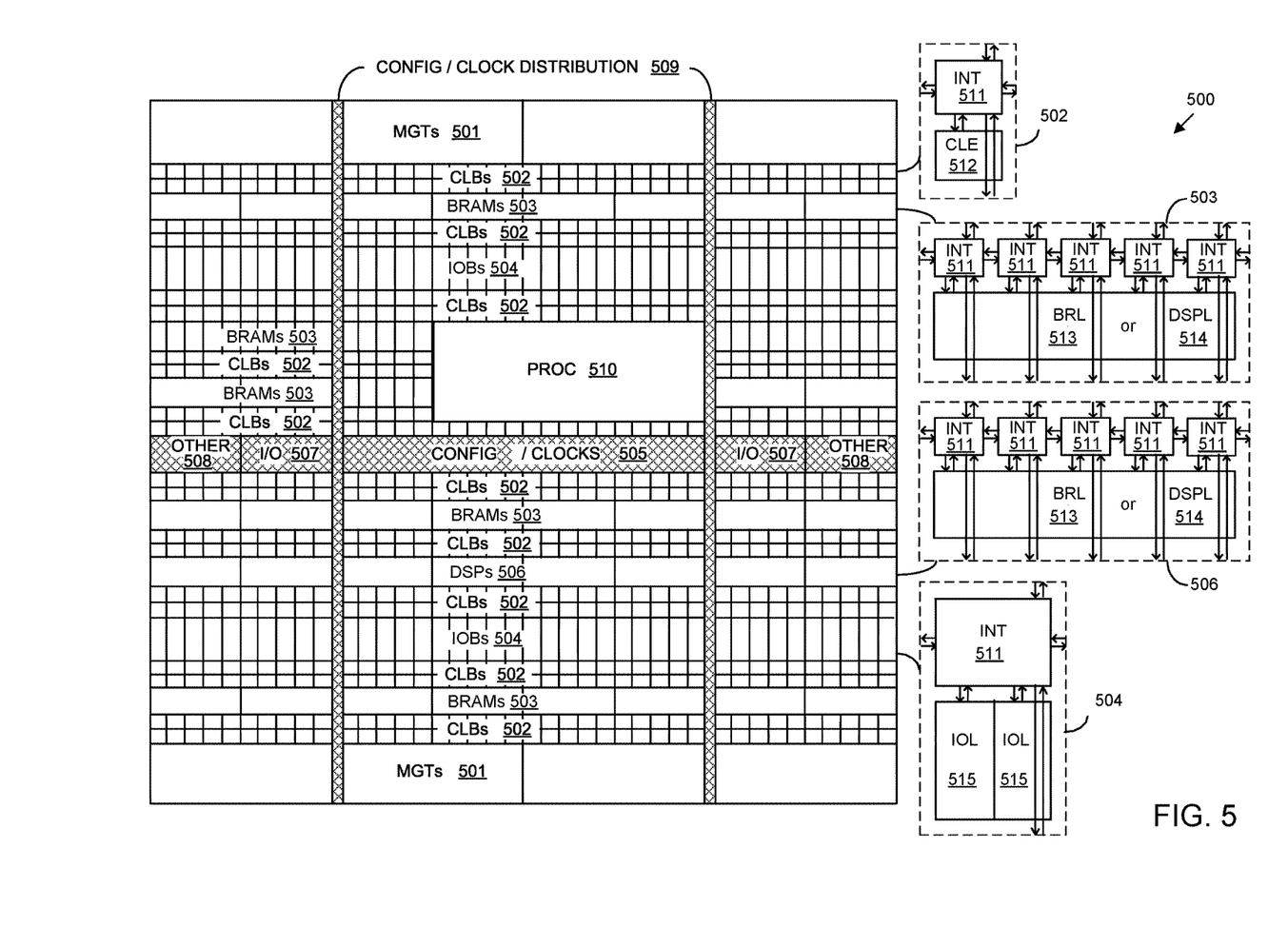
FIG. 5 illustrates an example architecture for an integrated circuit for implementing a kernel in hardware.

FIG. 5 illustrates an example architecture 500 for an IC. In one or more embodiments, architecture 500 is used to implement IC 125 of FIG. 1. In one aspect, architecture 500 may be implemented within a programmable IC. For example, architecture 500 may be used to implement a FPGA. Architecture 500 may also be representative of a system-on-chip (SOC) type of IC. An SOC is an IC that includes a processor that executes program code and one or more other circuits. The other circuits may be implemented as hardwired circuitry, programmable circuitry, and/or a combination thereof. The circuits may operate cooperatively with one another and/or with the processor.

As shown, architecture 500 includes several different types of programmable circuit, e.g., logic, blocks. For example, architecture 500 may include a large number of different programmable tiles including multi-gigabit transceivers (MGTs) 501, configurable logic blocks (CLBs) 502, random access memory blocks (BRAMs) 503, input/output blocks (IOBs) 504, configuration and clocking logic (CONFIG/CLOCKS) 505, digital signal processing blocks (DSPs) 506, specialized I/O blocks 507 (e.g., configuration ports and clock ports), and other programmable logic 508 such as digital clock managers, analog-to-digital converters, system monitoring logic, and so forth.

In some ICs, each programmable tile includes a programmable interconnect element (INT) 511 having standardized connections to and from a corresponding INT 511 in each adjacent tile. Therefore, INTs 511, taken together, implement the programmable interconnect structure for the illustrated IC. Each INT 511 also includes the connections to and from the programmable logic element within the same tile, as shown by the examples included at the top of FIG. 5.

For example, a CLB 502 may include a configurable logic element (CLE) 512 that may be programmed to implement user logic plus a single INT 511. A BRAM 503 may include a BRAM logic element (BRL) 513 in addition to one or more INTs 511. Typically, the number of INTs 511 included in a tile depends on the height of the tile. As pictured, a BRAM tile has the same height as five CLBs, but other numbers (e.g., four) also may be used. A DSP tile 506 may include a DSP logic element (DSPL) 514 in addition to an appropriate number of INTs 511. An 10B 504 may include, for example, two instances of an I/O logic element (IOL) 515 in addition to one instance of an INT 511. The actual I/O pads connected to IOL 515 may not be confined to the area of IOL 515.

In the example pictured in FIG. 5, a columnar area near the center of the die, e.g., formed of regions 505, 507, and 508, may be used for configuration, clock, and other control logic. Horizontal areas 509 extending from this column may be used to distribute the clocks and configuration signals across the breadth of the programmable IC.

Some ICs utilizing the architecture illustrated in FIG. 5 include additional logic blocks that disrupt the regular columnar structure making up a large part of the IC. The additional logic blocks may be programmable blocks and/or dedicated circuitry. For example, a processor block depicted as PROC 510 spans several columns of CLBs and BRAMs.

In one aspect, PROC 510 may be implemented as dedicated circuitry, e.g., as a hardwired processor, that is fabricated as part of the die that implements the programmable circuitry of the IC. PROC 510 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 510 may be omitted from architecture 500 and replaced with one or more of the other varieties of the programmable blocks described. Further, such blocks may be utilized to form a "soft processor" in that the various blocks of programmable circuitry may be used to form a processor that can execute program code as is the case with PROC 510.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 5 that are external to PROC 510 such as CLBs 502 and BRAMs 503 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

In one or more embodiments, one or more kernels as described herein can be implemented in programmable circuitry using the architecture described in connection with FIG. 2. For example, one or more kernels may be specified by a configuration bitstream that is loaded into an IC having an architecture the same as or similar to that of FIG. 5. Each kernel may be implemented using the architecture described in connection with FIG. 2.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 510.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SOC, the configuration bitstream may specify the circuitry that is to be implemented within the programmable circuitry and the program code that is to be executed by PROC 510 or a soft processor. In some cases, architecture 500 includes a dedicated configuration processor that loads the configuration bitstream to the appropriate configuration memory and/or processor memory. The dedicated configuration processor does not execute user-specified program code. In other cases, architecture 500 may utilize PROC 510 to receive the configuration bitstream, load the configuration bitstream into appropriate configuration memory, and/or extract program code for execution.

FIG. 5 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 5 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 510 within the IC are for purposes of illustration only and are not intended as limitations.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise. As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without user intervention. As defined herein, the term "user" means a human being. As defined herein, the term "responsive to" means responding or reacting readily to an action or event. Thus, if a second action is performed "responsive to" a first action, there is a causal relationship between an occurrence of the first action and an occurrence of the second action. The term "responsive to" indicates the causal relationship.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. Memory, as described herein, is an example of a computer readable storage medium. A non-exhaustive list of more specific examples of a computer readable storage medium may include: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

As defined herein, the term "output" means storing in physical memory, e.g., a device, writing to display or other peripheral output device, sending or transmitting to another system, exporting, or the like.

As defined herein, the terms "one embodiment," "an embodiment," "one or more embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," and similar language throughout this disclosure may, but do not necessarily, all refer to the same embodiment.

As defined herein, the term "processor" means at least one hardware circuit configured to carry out instructions contained in program code. The hardware circuit may be an integrated circuit. Examples of a processor include, but are not limited to, a CPU, an array processor, a vector processor, a DSP, an FPGA, a PLA, an ASIC, programmable logic circuitry, a graphics processing unit (GPU), a controller, and so forth.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

One or more embodiments are directed to methods for implementing a kernel as circuitry in an integrated circuit (IC). In one aspect, a method can include determining, using a processor, memory access operations and work operations from kernel program code. The method also can include generating, using the processor, a circuit design from the kernel program code. The circuit design implements a circuit architecture having a memory access circuit configured to perform the memory access operations and an execution circuit configured to perform the work operations concurrently with the memory access operations.

In an aspect, the memory access operations include read operations and write operations on a global memory.

In another aspect, the memory access circuit includes a read channel and a write channel independent of the read channel.

In another aspect, the method includes, in response to determining a buffer from the kernel program code, generating, within the circuit design, a shared memory, wherein the shared memory is configured to implement the buffer and is accessed by the memory access circuit and the execution circuit.

In another aspect, the memory access circuit is configured to exchange data between the shared memory and a global memory.

In another aspect, the method includes generating, within the circuit design, a read command FIFO memory coupling the execution circuit with the memory access circuit and generating, within the circuit design, a write command FIFO memory coupling the execution circuit with the memory access circuit.

In another aspect, the execution circuit is configured to send read commands to the memory access circuit via the read command FIFO memory and write commands to the memory access circuit via the write command FIFO memory.

In another aspect, the method further includes, in response to determining events within the kernel program code, generating a plurality of status registers for the events within the circuit design, wherein the plurality of status registers are accessible by the memory access circuit and the execution circuit, and wherein the plurality of status registers are updated to indicate status of read operations and write operations.

In another aspect, the method further includes generating, within the circuit design, global status registers indicating status of a read channel and a write channel of the memory access circuit, wherein the global status registers are accessible by the memory access circuit and the execution circuit.

One or more embodiments are directed to an IC having a hardware architecture for a kernel. The hardware architecture can include a shared memory circuit configured to implement a buffer of the kernel and a memory access circuit configured to perform memory access operations of the kernel. The memory access operations can include read operations and write operations that exchange data between a global memory and the shared memory. The hardware architecture can also include an execution circuit coupled to the memory access circuit and configured to perform work operations of the kernel using the data stored in the shared memory.

In an aspect, the hardware architecture includes a number of shared memory circuits corresponding to a number of buffers of the kernel.

In another aspect, the memory access circuit includes a read channel and a write channel independent of the read channel.

In another aspect, the hardware architecture includes a read command FIFO coupling the execution circuit with the memory access circuit and a write command FIFO memory coupling the execution circuit with the memory access circuit.

In another aspect, the execution circuit is configured to send read commands to the memory access circuit via the read command FIFO memory and write commands to the memory access circuit via the write command FIFO memory.

In another aspect, the hardware architecture further includes a plurality of status registers corresponding to events within the kernel, wherein the plurality of status registers are accessible by the memory access circuit and the execution circuit, and wherein the plurality of status registers are updated to indicate status of read operations and write operations.

In another aspect, the hardware architecture further includes a plurality of global status registers indicating status of a read channel and a write channel of the memory access circuit, wherein the global status registers are accessible by the memory access circuit and the execution circuit.

In another aspect, the integrated circuit is a programmable IC.

One or more embodiments are directed to systems for implementing a kernel as circuitry in an IC. In one aspect, a system includes a memory configured to store program code and a processor coupled to the memory. The processor, in response to executing the program code, is configured to initiate operations. The operations include determining memory access operations and work operations from kernel program code and generating a circuit design from the kernel program code. The circuit design implements a circuit architecture having a memory access circuit configured to perform the memory access operations and an execution circuit configured to perform the work operations concurrently with the memory access operations.

In an aspect, the memory access operations include read operations and write operations on a global memory.

In another aspect, the memory access circuit includes a read channel and a write channel independent of the read channel.

In another aspect, the processor is configured to initiate operations including, in response to determining a buffer from the kernel program code, generating, within the circuit design, a shared memory, wherein the shared memory is configured to implement the buffer and is accessed by the memory access circuit and the execution circuit.

In another aspect, the memory access circuit is configured to exchange data between the shared memory and a global memory.

In another aspect, the processor is configured to initiate operations including generating, within the circuit design, a read command FIFO memory coupling the execution circuit with the memory access circuit and generating, within the circuit design, a write command FIFO memory coupling the execution circuit with the memory access circuit.

In another aspect, the execution circuit is configured to send read commands to the memory access circuit via the read command FIFO memory and write commands to the memory access circuit via the write command FIFO memory.

In another aspect, the processor is configured to initiate operations including, in response to determining events within the kernel program code, generating a plurality of status registers for the events within the circuit design, wherein the plurality of status registers are accessible by the memory access circuit and the execution circuit, and wherein the plurality of status registers are updated to indicate status of read operations and write operations.

In another aspect, the processor is configured to initiate operations including, within the circuit design, global status registers indicating status of a read channel and a write channel of the memory access circuit, wherein the global status registers are accessible by the memory access circuit and the execution circuit.

One or more embodiments are directed to computer program products for implementing a kernel as circuitry in an IC. In one aspect, a computer program product includes a computer readable storage medium having program code stored thereon. The program code is executable by a processor to perform the various operations described herein.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method for implementing a kernel as circuitry in an integrated circuit, comprising:
   determining, using a processor, memory access operations and work operations from kernel program code; and
   generating, using the processor, a circuit design from the kernel program code, wherein the circuit design implements a circuit architecture having a memory access circuit configured to perform the memory access operations and an execution circuit configured to perform the work operations concurrently with the memory access operations.

2. The method of claim 1, wherein the memory access operations comprise read operations and write operations on a global memory.

3. The method of claim 1, wherein the memory access circuit comprises a read channel and a write channel independent of the read channel.

4. The method of claim 1, further comprising:
   in response to determining a buffer from the kernel program code, generating, within the circuit design, a shared memory, wherein the shared memory is configured to implement the buffer and is accessed by the memory access circuit and the execution circuit.

5. The method of claim 4, wherein the memory access circuit is configured to exchange data between the shared memory and a global memory.

6. The method of claim 1, further comprising:
   generating, within the circuit design, a read command first-in-first-out memory coupling the execution circuit with the memory access circuit; and
   generating, within the circuit design, a write command first-in-first-out memory coupling the execution circuit with the memory access circuit.

7. The method of claim 6, wherein the execution circuit is configured to send read commands to the memory access circuit via the read command first-in-first-out memory and write commands to the memory access circuit via the write command first-in-first-out memory.

8. The method of claim 1, further comprising:
   in response to determining events within the kernel program code, generating a plurality of status registers for the events within the circuit design, wherein the plurality of status registers are accessible by the memory access circuit and the execution circuit, and wherein the plurality of status registers are updated to indicate status of read operations and write operations.

9. The method of claim 8, further comprising:
   generating, within the circuit design, global status registers indicating status of a read channel and a write channel of the memory access circuit, wherein the global status registers are accessible by the memory access circuit and the execution circuit.

10. An integrated circuit having a hardware architecture for a kernel, wherein the hardware architecture comprises:
    a shared memory circuit configured to implement a buffer of the kernel;
    a memory access circuit configured to perform memory access operations of the kernel, wherein the memory access operations comprise read operations and write operations that exchange data between a global memory and the shared memory; and
    an execution circuit coupled to the memory access circuit and configured to perform work operations of the kernel using the data stored in the shared memory.

11. The integrated circuit of claim 10, wherein the hardware architecture includes a number of shared memory circuits corresponding to a number of buffers of the kernel.

12. The integrated circuit of claim 10, wherein the memory access circuit comprises a read channel and a write channel independent of the read channel.

13. The integrated circuit of claim 10, wherein the hardware architecture further comprises:
    a read command first-in-first-out memory coupling the execution circuit with the memory access circuit; and
    a write command first-in-first-out memory coupling the execution circuit with the memory access circuit.

14. The integrated circuit of claim 13, wherein the execution circuit is configured to send read commands to the memory access circuit via the read command first-in-first-out memory and write commands to the memory access circuit via the write command first-in-first-out memory.

15. The integrated circuit of claim 10, wherein the hardware architecture further comprises:
a plurality of status registers corresponding to events within the kernel, wherein the plurality of status registers are accessible by the memory access circuit and the execution circuit, and wherein the plurality of status registers are updated to indicate status of read operations and write operations.

16. The integrated circuit of claim 15, wherein the hardware architecture further comprises:
a plurality of global status registers indicating status of a read channel and a write channel of the memory access circuit, wherein the global status registers are accessible by the memory access circuit and the execution circuit.

17. The integrated circuit of claim 10, wherein the integrated circuit is a programmable integrated circuit.

18. A system for implementing a kernel as circuitry in an integrated circuit, comprising:
a memory configured to store program code; and
a processor coupled to the memory, wherein the processor, in response to executing the program code, is configured to initiate operations including:
determining memory access operations and work operations from kernel program code; and
generating a circuit design from the kernel program code, wherein the circuit design implements a circuit architecture having a memory access circuit configured to perform the memory access operations and an execution circuit configured to perform the work operations concurrently with the memory access operations.

19. The system of claim 18, wherein the processor is configured to initiate operations further including:
in response to determining a buffer from the kernel program code, generating, within the circuit design, a shared memory, wherein the shared memory is configured to implement the buffer and is accessed by the memory access circuit and the execution circuit;
generating, within the circuit design, a read command first-in-first-out memory coupling the execution circuit with the memory access circuit; and
generating, within the circuit design, a write command first-in-first-out memory coupling the execution circuit with the memory access circuit.

20. The system of claim 18, wherein the processor is configured to initiate operations further including:
in response to determining events within the kernel program code, generating a plurality of status registers for the events within the circuit design, wherein the plurality of status registers are accessible by the memory access circuit and the execution circuit, and wherein the plurality of status registers are updated to indicate status of read operations and write operations; and
generating, within the circuit design, global status registers indicating status of a read channel and a write channel of the memory access circuit, wherein the global status registers are accessible by the memory access circuit and the execution circuit.

* * * * *